(12) United States Patent
    Liao et al.

(10) Patent No.: US 11,137,675 B2
(45) Date of Patent: Oct. 5, 2021

(54) MASK AND METHOD FOR FORMING THE SAME

(71) Applicant: TAIWAN SEMICONDUCTOR MANUFACTURING CO., LTD., Hsinchu (TW)

(72) Inventors: Chi-Hung Liao, New Taipei (TW); Ju-Wei Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 210 days.

(21) Appl. No.: 16/212,442

(22) Filed: Dec. 6, 2018

(65) Prior Publication Data

US 2020/0057365 A1 Feb. 20, 2020

Related U.S. Application Data

(60) Provisional application No. 62/718,395, filed on Aug. 14, 2018.

(51) Int. Cl.
    *G03F 1/38* (2012.01)
    *H01L 21/033* (2006.01)
    *G03F 1/36* (2012.01)
    *G03F 1/54* (2012.01)
    *G03F 1/52* (2012.01)

(52) U.S. Cl.
    CPC .................. *G03F 1/38* (2013.01); *G03F 1/36* (2013.01); *G03F 1/52* (2013.01); *G03F 1/54* (2013.01); *H01L 21/0332* (2013.01)

(58) Field of Classification Search
    None
    See application file for complete search history.

(56) References Cited

U.S. PATENT DOCUMENTS

| 6,249,932 | B1 * | 6/2001 | Chu | A47L 9/08 |
| | | | | 15/345 |
| 7,407,729 | B2 * | 8/2008 | Schwarzl | B82Y 10/00 |
| | | | | 430/5 |
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |

(Continued)

FOREIGN PATENT DOCUMENTS

| CN | 103529640 A | 1/2014 |
| CN | 103579531 A | 2/2014 |

(Continued)

OTHER PUBLICATIONS

English translation of KR 10-0774048. (Year: 2007).*

*Primary Examiner* — Kathleen Duda
(74) *Attorney, Agent, or Firm* — Maschoff Brennan

(57) ABSTRACT

A method includes clamping a mask on a mask stage, in which the mask includes a multilayered magnetic film; performing a first lithography process by using the mask; moving the mask away from the mask stage; and determining whether a surface condition of a surface layer of the multilayered thin film is acceptable; and peeling the surface layer of the multilayered magnetic film from the multilayered magnetic film when the surface condition of the surface layer is determined as unacceptable.

20 Claims, 18 Drawing Sheets

(56) References Cited

U.S. PATENT DOCUMENTS

| | | |
|---|---|---|
| 8,962,224 B2 | 2/2015 | Wu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2006/0130886 A1* | 6/2006 | Tada .................. B24C 1/003 134/198 |
| 2012/0307218 A1* | 12/2012 | Kamo ................ G03F 7/70283 355/52 |
| 2014/0011121 A1 | 1/2014 | Yu et al. |

FOREIGN PATENT DOCUMENTS

| | | |
|---|---|---|
| CN | 105220110 A | 1/2016 |
| KR | 10-0774048 | * 11/2007 |
| TW | 201409537 A | 3/2014 |
| TW | I611998 B | 1/2018 |
| WO | 2018135468 A1 | 7/2018 |

* cited by examiner

MASK AND METHOD FOR FORMING THE SAME

PRIORITY CLAIM AND CROSS-REFERENCE

This application claims priority to U.S. Provisional Application Ser. No. 62/718,395, filed Aug. 14, 2018, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, an absorption layer however may not fully absorb the incident light and a portion of the incident light is reflected from the absorption layer. Also the thickness of the absorption layer causes the shadowing effect. All of these often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
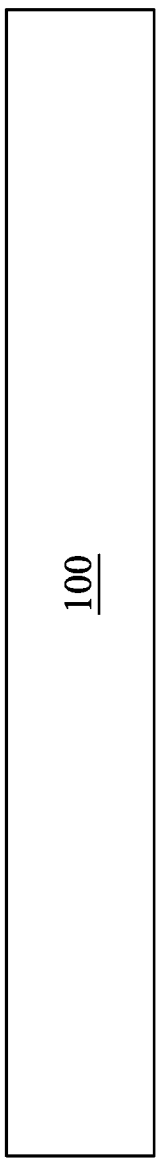
FIGS. 1 to 9 are cross-sectional views of a method for manufacturing a mask at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1 to 9 are cross-sectional views of a method for manufacturing a mask at various stages in accordance with some embodiments of the present disclosure. The following description refers to a mask and a mask fabrication process. The mask fabrication process includes two steps: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Reference is made to FIG. 1. A substrate 100 is received. In some embodiments, the substrate 100 may be made of low thermal expansion material (LTEM). In some embodiments, the LTEM material may include quartz, silicon, silicon carbide, and silicon oxide-titanium oxide compound. Alternatively, the LTEM material may include $TiO_2$ doped $SiO_2$, and/or other low thermal expansion materials known in the art. During operation, the LTEM substrate 100 serves to reduce image distortion due to mask heating. In some embodiments, the LTEM substrate 100 includes materials with a low defect level and a smooth surface.

Figure 2A:
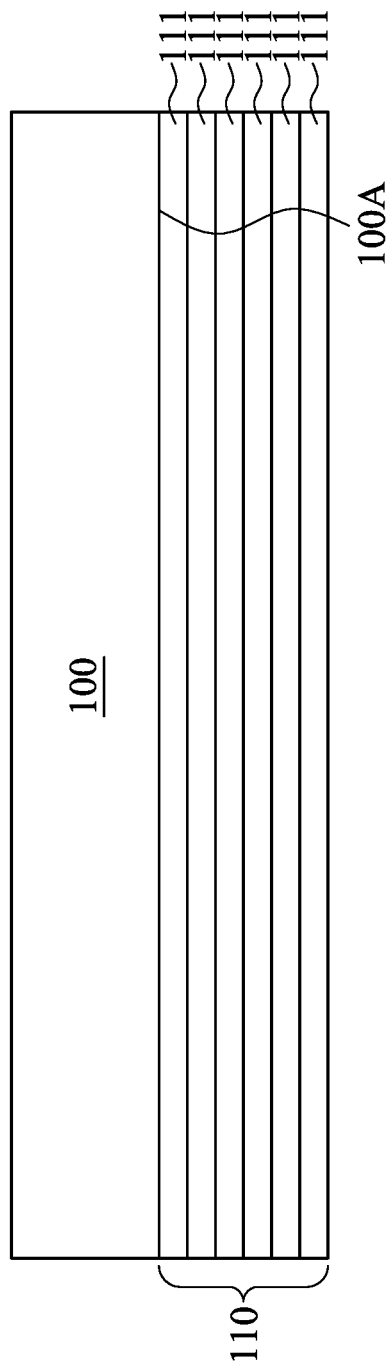
Figure 2B:
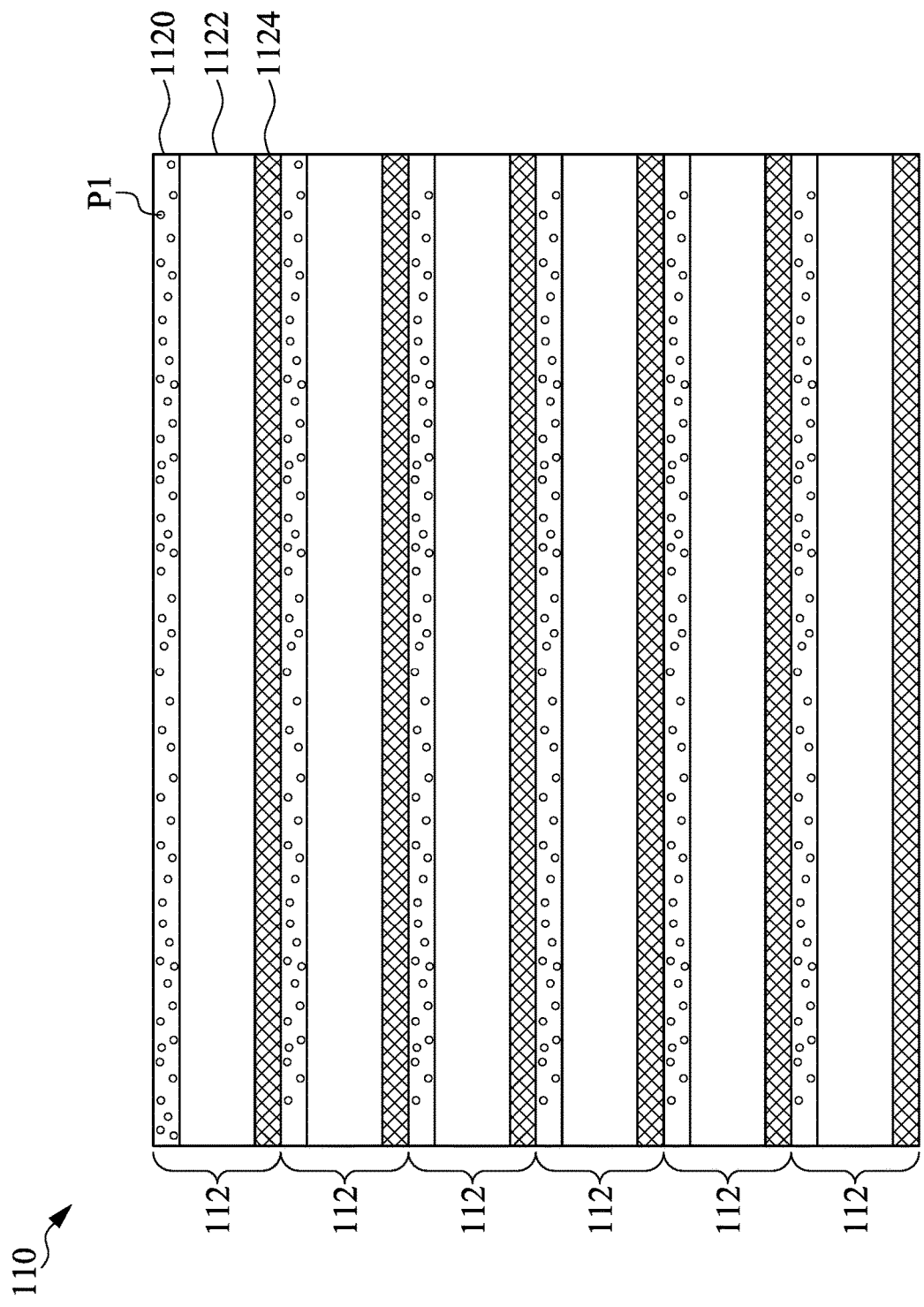
Figure 2C:
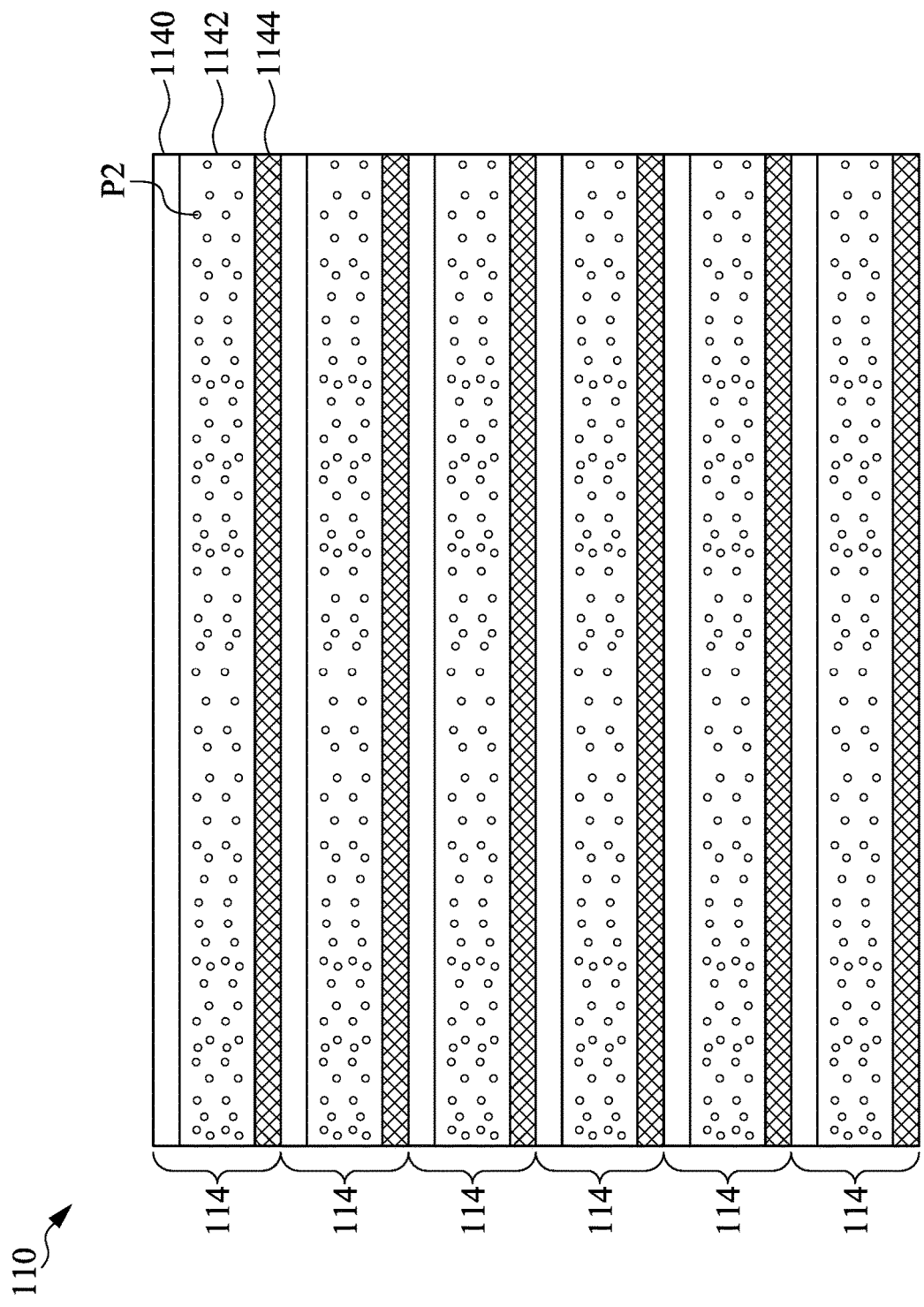

Reference is made to FIGS. 2A to 2C. A multilayered magnetic film 110 is formed on a first side 100A of the LTEM substrate 100. For example, the first side 100A is a back side of the substrate 100. In some embodiments, the multilayered magnetic film 110 includes a plurality of magnetic layers 111 alternately stacked. The magnetic property of the multilayered magnetic film 110 results in strengthened attachment between the multilayered magnetic film 110 and a mask stage (not shown). In some embodiments, the multilayered magnetic film 110 is a stretch releasing film, and the films 111 of the multilayered thin film 110 have strong holding power with clean removal and no surface damage. That is, a surface layer 111 can be cleanly peeled from a remaining layer 111 of the magnetic film 110 without damaging the surface of the remaining layer 111. Therefore, the magnetic layers 111 are detachable or releasable with each other. Details will be described later. In some embodiments, the magnetic layer 111 is a magnetic tape (or magnetic strip).

The multilayered magnetic film 110 may be formed by stacking the magnetic layers 111, layer by layer, on the first side 100A of the substrate 100 (referring to FIG. 2A). For example, a magnetic layer 111 is initially attached to the substrate 100. Then, another magnetic layer 111 is then attached to the previous magnetic layer 111. This process is repeated until the multilayered magnetic film 110 reach a desired thickness. In some embodiments, the thickness of each magnetic layer 111 is in a range of about 10 μm to about 20 μm. The thickness of the multilayered magnetic film 110 is in a range of about 50 μm to about 100 μm. If the thickness of the multilayered magnetic film is greater than 100 μm, it would affect the flatness uniformity when clamped on the chuck. In some embodiments, the number of the magnetic layers 111 is 5 or 6. If the number of the magnetic layers 111 is less than 5, it would not provide sufficient productivity. If the number of the magnetic layers 111 is greater than 6, it would affecting the flatness of the underneath magnetic layer 111 when peeling away the topmost magnetic layer 111.

Reference is made to FIG. 2B. Shown there is an example of the multilayered magnetic film 110. In some embodiments, the multilayered magnetic film 110 includes a plurality of magnetic layers 112, in which each of the magnetic layers 112 includes a magnetic adhesive layer 1120, a base layer 1122, and a release layer 1124. The magnetic adhesive layer 1120 and the release layer 1124 are coated on opposite sides of the base layer 1122, respectively. As described above, each of the magnetic layers 112 are stacked on each other, such that the magnetic adhesive layer 1120 of a magnetic layer 112 is connected to the release layer 1124 of another magnetic layer 112, such that the magnetic layers 112 are unwind readily after the magnetic layers 112 are connected to each other. In this way, the multilayered magnetic film 110 is formed as a stretch releasing film, in that the magnetic layers 112 of the multilayered magnetic film 110 have strong holding power with clean removal and no surface damage. That is, a magnetic layer 112 can be cleanly removed from a surface of another magnetic layer 112 without damaging the surface of another magnetic layer 112. In some embodiments, the, the base layer 1122 is made from a mixture of plastic, rubber or resin material and magnetizable material. In some embodiments, the release layer 1124 may include a silicone release composition and the capsules of microencapsulated materials which can be prepared by mixing the microencapsulated material with a silicone-release composition.

In some embodiments, the magnetic adhesive layer 1120 includes magnetic filler P1 and thus has properties of a paramagnetic material. Thus, when electricity is applied to an electromagnetic structure (e.g., the mask stage 210 in FIG. 11), attractive force is generated between the magnetic adhesive layer 1120 and the electromagnetic structure, so as to clamp the multilayered magnetic film 110 on the electromagnetic structure. In some embodiments, the magnetic filler P1 may include paramagnetic material such as tantalum (Ta), niobium (Nb), and vanadium (V). Paramagnetism results from unpaired electrons in the material, so atoms with incompletely filled atomic orbitals are paramagnetic. Due to the spin, unpaired electrons have a magnetic dipole moment and thus act like a magnet. When an external magnetic field is applied, the magnetic field causes the electrons' spins to align parallel to the field, thus resulting in net attraction. On the other hand, if the external magnetic field is removed, the attraction of the paramagnetic material would disappear. Thus, if the multilayered magnetic film 110 includes paramagnetic material, it can be attached to or detached from the electromagnetic structure by controlling an external magnetic field. If the multilayered magnetic film 110 includes ferromagnetic material, permanent magnetism of the ferromagnetic material may cause increased difficulty of detaching the multilayered magnetic film 110 from the electromagnetic structure.

Reference is made to FIG. 2C. Shown there is an example of the multilayered magnetic film 110. In some embodiments, the multilayered magnetic film 110 includes a plurality of magnetic layers 114, in which each of the magnetic layers 114 includes an adhesive layer 1140, a magnetic base layer 1142, and a release layer 1144. The adhesive layer 1140 and the release layer 1144 are coated on opposite sides of the magnetic base layer 1142, respectively. As described above, the each of the magnetic layers 114 are stacked on each other, such that the adhesive layer 1140 of a magnetic layer 114 is connected to the release layer 1144 of another magnetic layer 114, such that the magnetic layers 114 are unwind readily after the magnetic layers 114 are connected to each other. In this way, the multilayered magnetic film 110 is formed as a stretch releasing film, in that the magnetic layers 114 of the multilayered magnetic film 110 have strong holding power with clean removal and no surface damage. That is, a magnetic layer 114 can be cleanly removed from a surface of another magnetic layer 114 without damaging the surface of another magnetic layer 114. In some embodiments, the, the magnetic base layer 1142 is made from a mixture of plastic, rubber or resin material and magnetizable material. In some embodiments, the release layer 1144 may include a silicone release composition and the capsules of microencapsulated materials which can be prepared by mixing the microencapsulated material with a silicone-release composition.

In some embodiments, the magnetic base layer 1142 includes magnetic filler P2 and thus has properties of a paramagnetic material. Thus, when electricity is applied to an electromagnetic structure (e.g., the mask stage 210 in FIG. 11), attractive force is generated between the magnetic base layer 1142 and the electromagnetic structure, so as to clamp the multilayered magnetic film 110 on the electromagnetic structure. In some embodiments, the magnetic filler P2 may include paramagnetic material such as tantalum (Ta), niobium (Nb), and vanadium (V).

Figure 3:
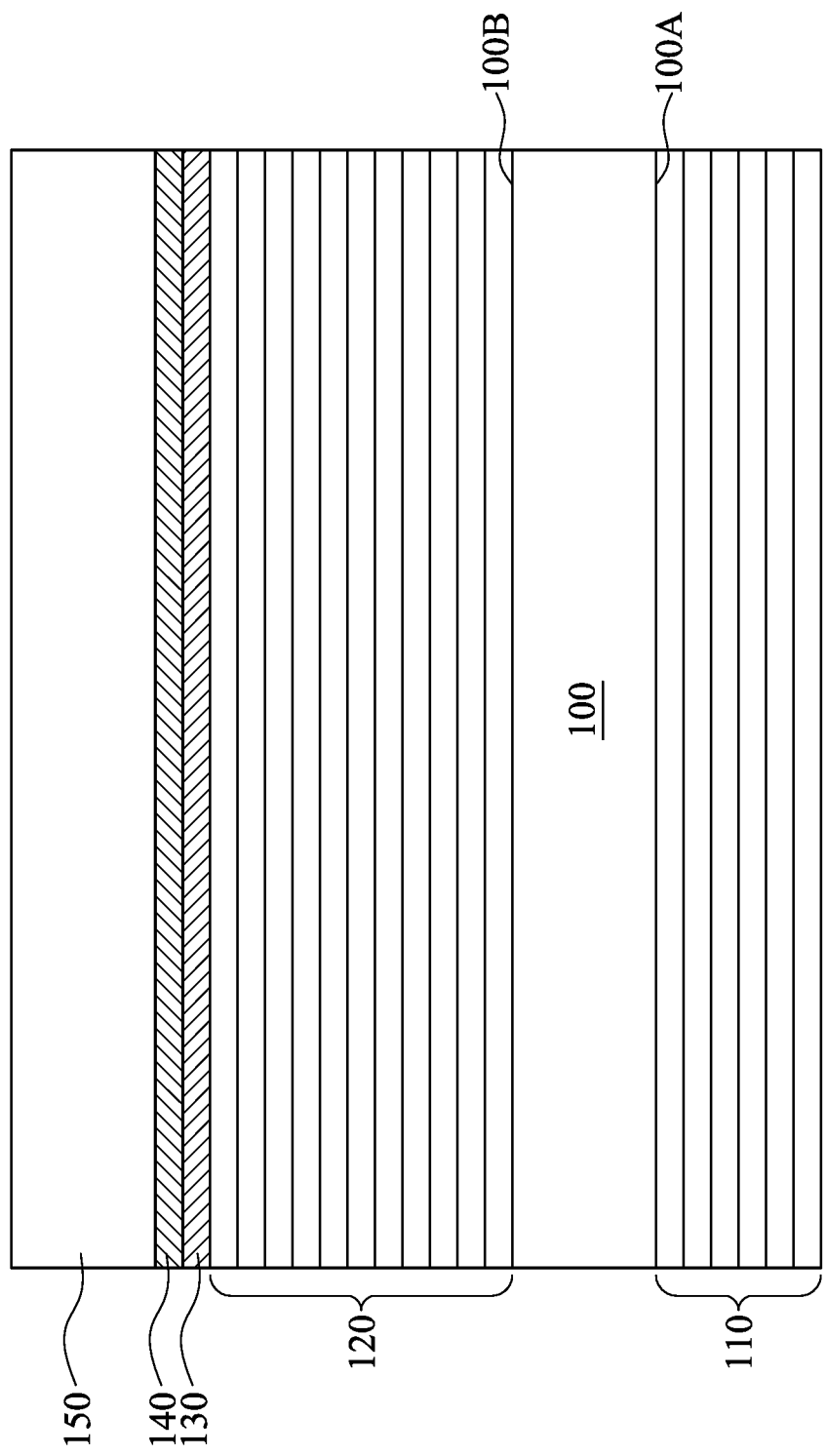

Reference is made to FIG. 3. A reflective multilayer (ML) 120 is formed on the second side 100B of the substrate 100. According to Fresnel equations, light reflection occurs when light propagates across the interface between two materials of different refractive indices. Light reflection is larger when the difference of refractive indices is larger. To increase light reflection, one may also increase the number of interfaces by forming a multilayer of alternating materials and let light to be reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any two materials or material combinations with large difference in refractive indices and small extinction coefficients. The thickness of each layer of the reflective ML 120 depends on the wavelength of the incident light and the angle of incidence on the mask. For a specified angle of incidence, the thickness of the reflective ML 120 is adjusted to achieve maximal constructive interference for lights reflected at different interfaces of the ML 120. In some embodiments, the number of film pairs of the reflective ML 120 is in a range of about 20 to about 80, however any number of film pairs is possible. In some embodiments, the reflective ML 120 includes forty pairs of layers of Mo/Si. Each Mo/Si film pair has a thickness of about 7 nm, e.g., 3 nm for Mo and 4 nm for Si. In some embodiments of the present disclosure, a reflectivity of about 70% may be achieved.

A capping layer 130 is disposed over the reflective ML 120. In the depicted embodiments, the capping layer 130 may include a silicon-containing material, such as silicon. For example, the capping layer 130 is a silicon layer of a topmost Mo/Si film pair of the reflective ML 120. The capping layer 130 can prevent oxidation of the reflective ML 120, for example, during processing of the mask. The capping layer 130 may thus include a material, other than a silicon-containing material, that prevents oxidation of the reflective ML 120. In some embodiments, the capping layer 130 has a thickness of about 4 nm to about 7 nm.

A buffer layer 140 is disposed over the capping layer 130. The buffer layer 140 includes a material that protects the reflective ML 120 during processing of the mask (for example, during etching of an absorption layer of the mask). In the depicted embodiments, the buffer layer 140 includes a ruthenium-containing material, such as Ru, RuNb, RuZr, RuMo, RuY, RuB, RuTi, RuLa, other ruthenium-containing material, or combinations thereof. Alternatively, the buffer layer 140 includes a chromium-containing material, such as Cr, CrN, CrO, CrC, CrON, CrCN, CrOC, CrOCN, other chromium-containing material, or combinations thereof. In yet another alternative, the buffer layer 140 includes materials other than ruthenium-containing materials and chromium-containing materials. The buffer layer 140 may include a combination of ruthenium-containing material, chromium-containing material, and other material, for example, where the buffer layer 140 includes multiple layers. In an example, the buffer layer 140 has a thickness of about 2 nm to about 5 nm. It is noted that, in alternative embodiments, the capping layer 130 and buffer layer 140 may be a single layer.

An absorption layer 150 is disposed over the buffer layer 140. The absorption layer 150 includes one or more layers designed to absorb radiation in the radiation type/wavelength range projected onto the mask. In the depicted embodiments, the one or more layers of the absorption layer 150 are designed to absorb EUV radiation. The one or more layers include various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the mask 100. For example, etching characteristics of the one or more layers of the absorption layer 150 provide process flexibility, which can reduce manufacturing time and costs.

According to the above descriptions, one or more of the reflective ML 120, the capping layer 130, the buffer layer 140, and the absorption layer 150 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other suitable methods.

Figure 4:
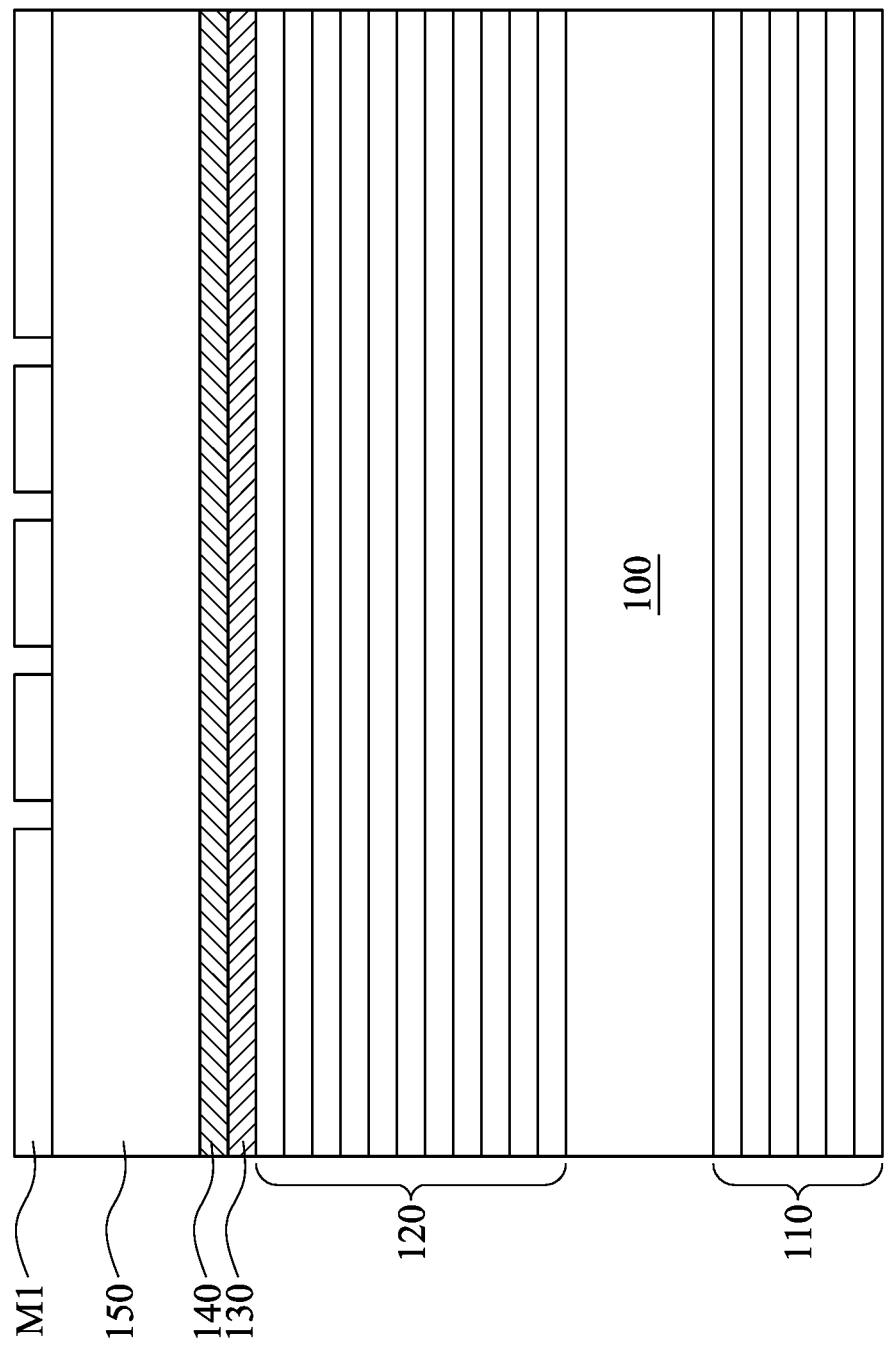

Reference is made to FIG. 4. A first photoresist layer M1 is formed on the absorption layer 150. In some embodiments, the first photoresist layer M1 may be a laser beam resist, and the photoresist layer may be formed by suitable method such as spin-on coating. Then, the first photoresist layer M1 is patterned based on a received design layout. In some embodiments, the first photoresist layer M1 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer may include soft baking, mask aligning, exposure, post-exposure baking, developing the photoresist, rinsing, drying (e.g., hard baking), other suitable processes, and/or combinations thereof.

Figure 5:
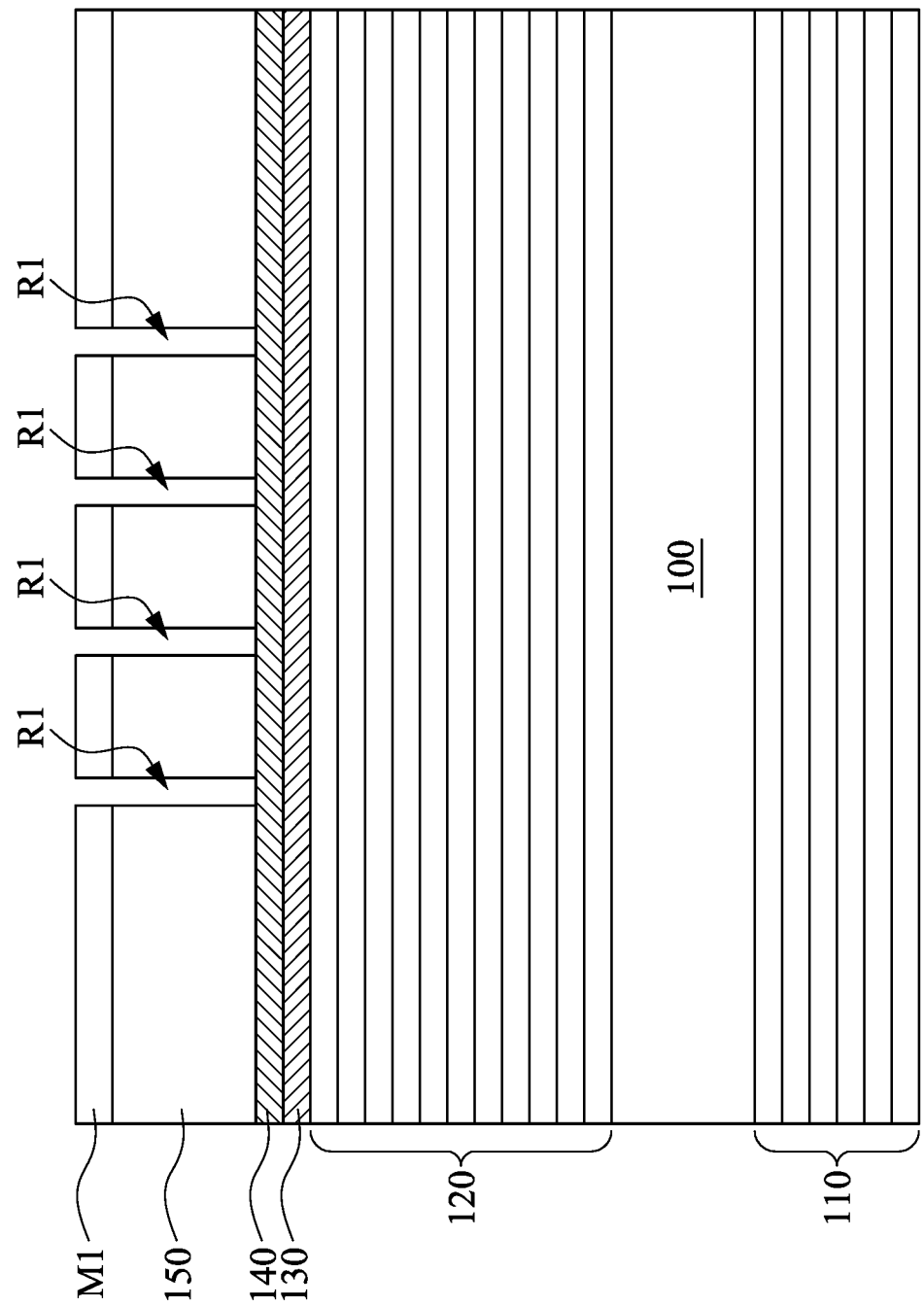

Reference is made to FIG. 5. The absorption layer 150 is patterned. In some embodiments where the first photoresist layer M1 is formed, the absorption layer 150 is patterned using the first photoresist layer M1 as a mask to form a plurality of recesses R1 therein. This process may be referred to as a pattern transfer, in that the pattern of the first photoresist layer M1 is transferred to the absorption layer 150. In some embodiments, patterning the absorption layer 150 includes one or more etching processes to selectively remove portions of the absorption layer 150 until the buffer layer 140 is exposed. The etching processes may include dry etching, wet etching, and/or other etching methods.

Figure 6:
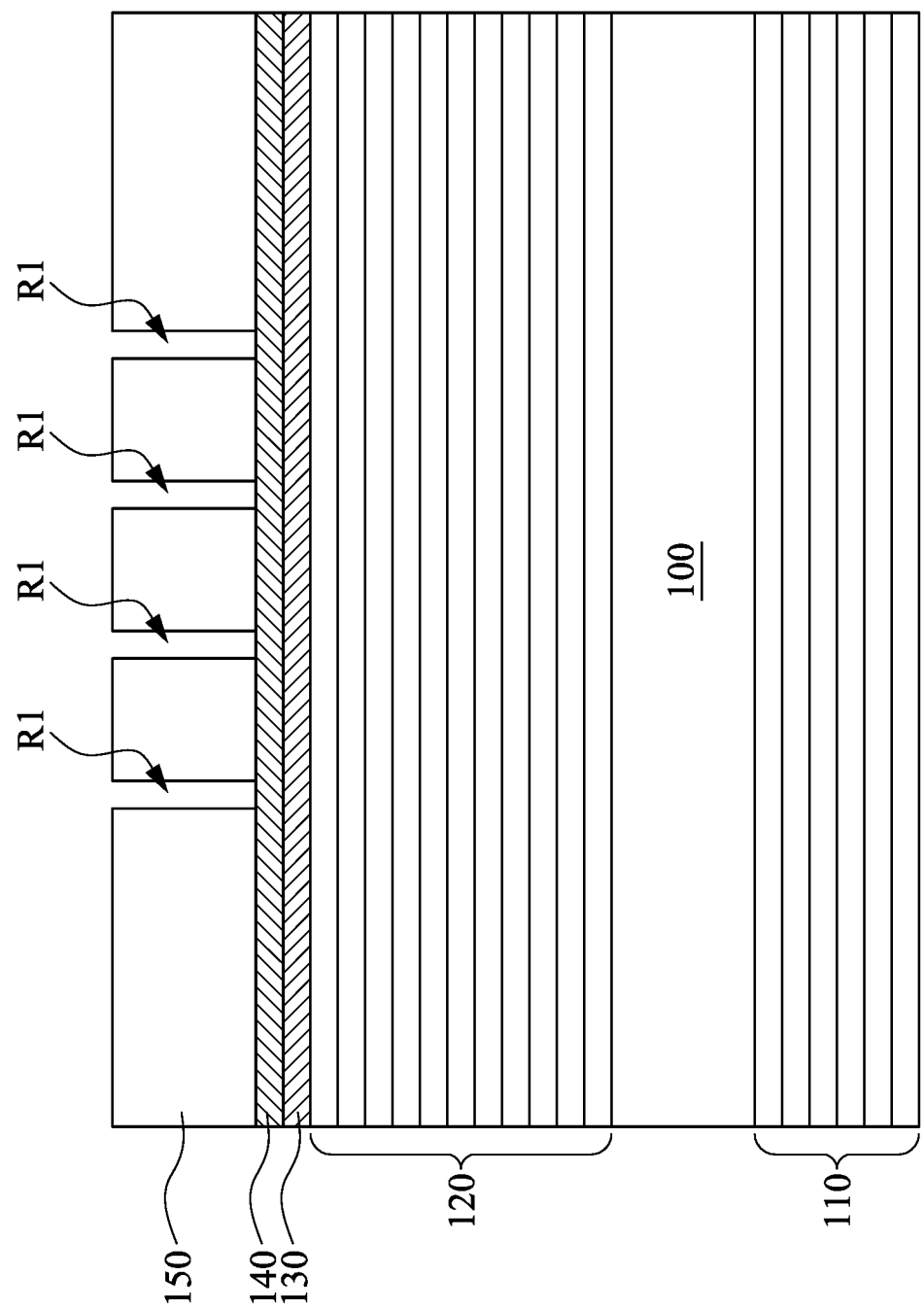

Reference is made to FIG. 6. The first photoresist layer M1 (see FIG. 7) is stripped from the absorption layer 150.

Figure 7:
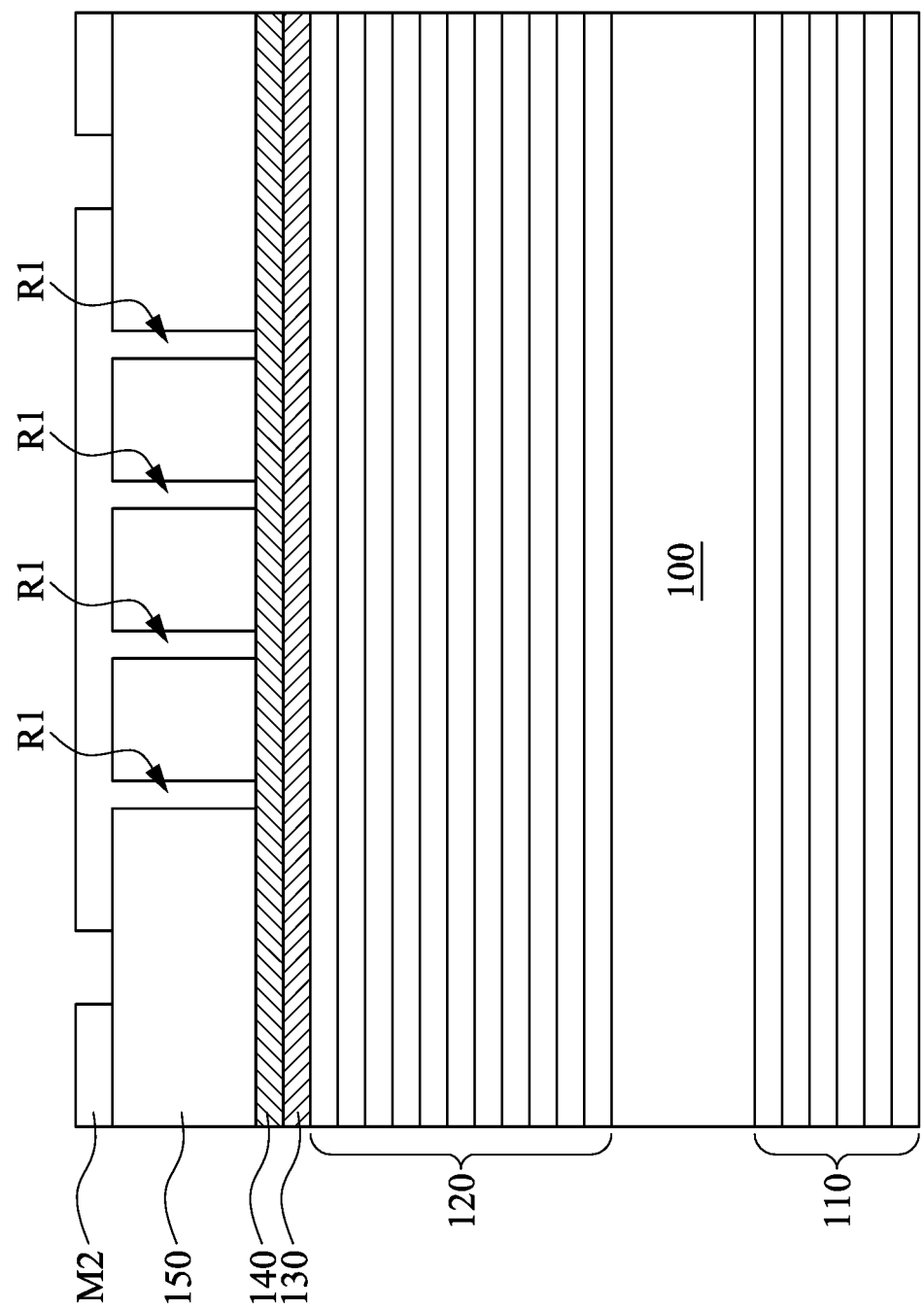

Reference is made to FIG. 7. A second photoresist layer M2 is formed on the absorption layer 150. The second photoresist layer M2 may be a positive-type resist or a negative-type resist. The second photoresist layer M2 may be an e-beam resist. Then, the second photoresist layer M2 is patterned using suitable method including electron beam (e-beam) writing, ion-beam writing, photolithography, and/or maskless photolithography. Patterning the second photoresist layer M2 may further include soft baking, mask aligning, exposure, post-exposure baking, developing the photoresist, rinsing, drying (e.g., hard baking), other suitable processes, and/or combinations thereof.

Figure 8:
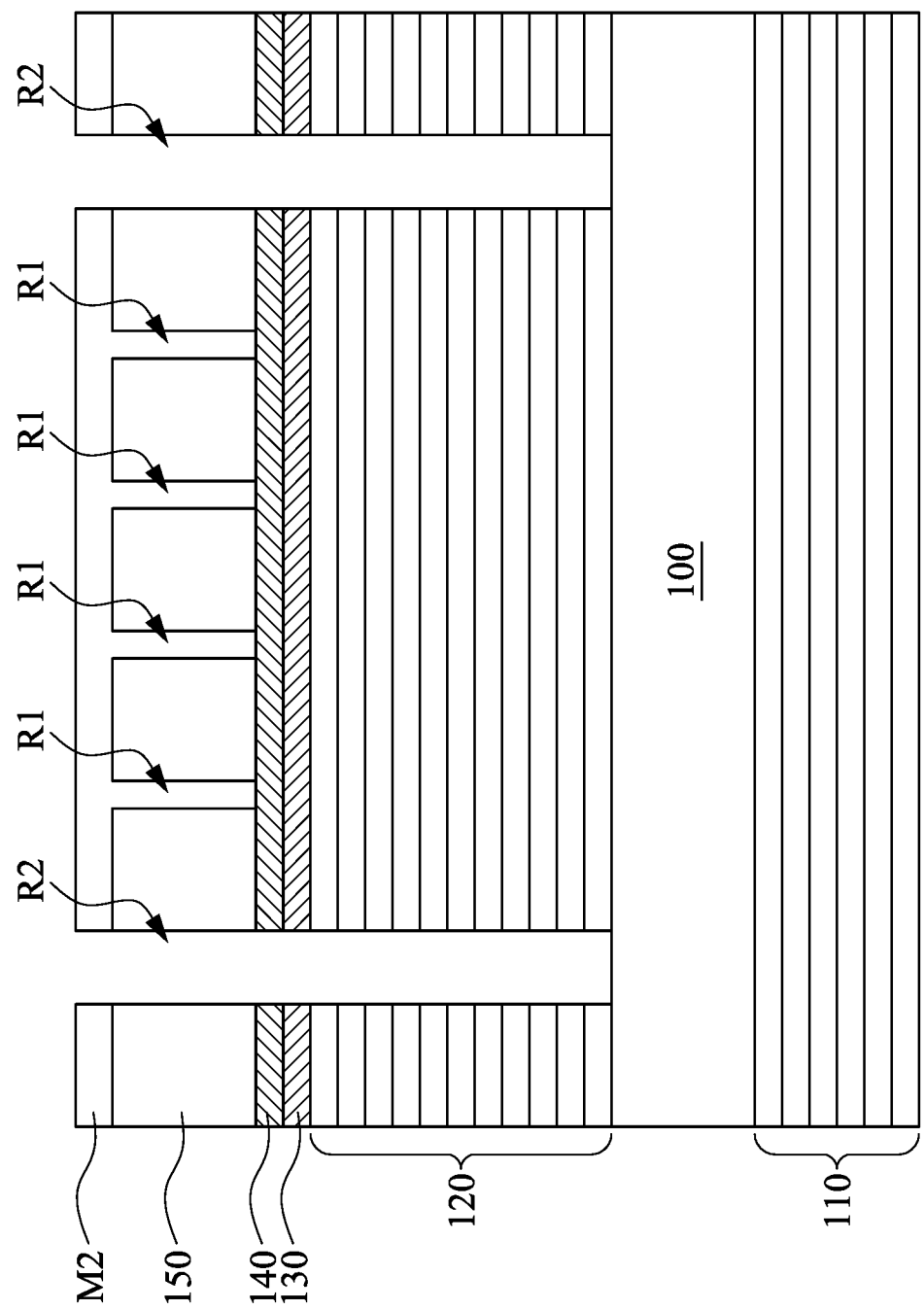

Reference is made to FIG. 8. The absorption layer 150, the buffer layer 140, the capping layer 130, and the reflective ML 120 are patterned to form a plurality of recesses R2 therein. In some embodiments, the absorption layer 150, the buffer layer 140, the capping layer 130, and the reflective ML 120 are patterned using the second photoresist layer M2 until the substrate 100 is exposed. This process may be referred to as a pattern transfer. The absorption layer 150, the buffer layer 140, the capping layer 130, and the reflective ML 120 may be patterned via a multistep etching process or a single step etching process. In an exemplary single step etching process, a dry etching is performed using fluorine-containing gas chemistry such as $CF_4$, $SF_6$, $NF_3$, and/or any other suitable gas. In some other embodiments, the patterning process may be controlled such that the recesses R2 may extend into the reflective ML 120 but not expose the substrate 100.

Figure 9:
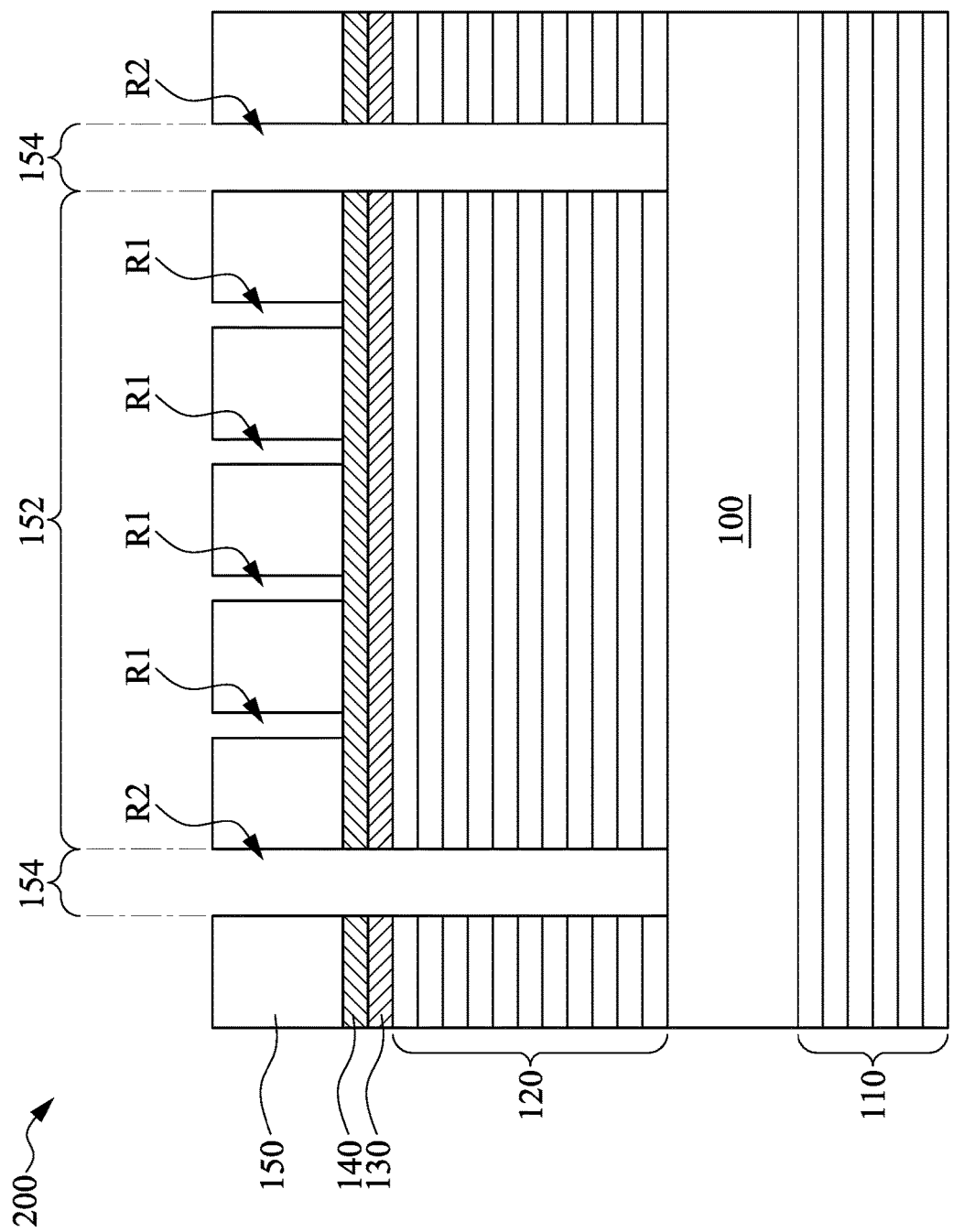

Reference is made to FIG. 9. The second photoresist layer M2 (see FIG. 10) is stripped from the absorption layer 150. Accordingly, a mask 200 is formed. In some embodiments, the mask 200 includes a mask image region 152 and a black border region 154 surrounding the mask image region 152. During operation, the mask 200 is used to transfer the pattern of the mask image region 152 to a wafer. For example, during an exposure process, light (radiation) is projected onto the mask 200, and a portion of the light is transmitted to the wafer, thereby transferring the pattern of the mask image region 152 to the wafer.

In some embodiments, the mask image region 152 of the mask 200 is defined by the recesses R1 formed in the absorption layer 150, in which the recesses R1 expose the top surface of the buffer layer 140. On the other hands, the black border region 154 of the mask 200 is defined by the recesses R2 formed in the absorption layer 150, the buffer layer 140, the capping layer 130, and the reflective ML 120. In some embodiments shown in FIG. 9, the recesses R2 extend into the reflective ML 120 and expose the top surface of the substrate 100. That is, the recesses R2 are deeper than the recesses R1.

During the exposure process of the mask, exposure light may leak to adjacent regions. Such light leakage can be attributed to light diffraction phenomenon, positional accuracy of the mask with respect to the wafer, positional accuracy of the mask with respect to the exposure tool, other phenomena, or combinations thereof. For example, light leakage may result from positional accuracy of the mask with respect to the exposure tool, such as the stepper or the scanner. For example, for each exposure process, the exposure tool defines a portion of the mask 200 for exposing light thereon. An exposure slit of the exposure tool (defined by blades of the exposure tool, in an example) may define the portion of the mask 200 that will be exposed to the light. Ideally, the light exposes the mask image region 152 of the mask 200. Typically, however, the exposure slit will expose an area of the mask 200 outside the mask image region 152. In some embodiments of the present disclosure, the mask black border region 154 of the mask 200 represents an area of the mask 200 that is outside the mask image region 152 that will be exposed to the light (in other words, an area of the mask 200 outside the mask image region that is not covered by the exposure tool). Here, the mask black border region 154 of the mask 200 is adjacent to the mask image region 152. Because the mask black border region 154 of the mask 200 is exposed to light during the exposure process, the mask black border region 154 undesirably transmits a portion of light to the wafer, resulting in some regions receiving double exposure and corners of the fields receiving quadruple exposure. To remedy such light leakage, reflectivity of the mask black border region 154 of the mask 200 is minimized to reduce such unwanted exposure. In an example, a reflectivity at the mask black border region 154 of the mask 200 is less than or equal to about 0.3%. For example, the profile of the mask black border region 154 is configured to allow radiation to be transmitted through the recesses R2 to a deeper structure of the mask 200 such as the substrate 100. In some embodiments, the recesses R2 expose the substrate 100 that is made of LTEM material. Because the LTEM material has a property that can absorb the incident radiation, the reflectivity of the black border region 154 may be reduced, accordingly.

In some embodiments shown in FIGS. 1 to 9, the multilayered magnetic film 110 is formed on the substrate 100 prior to forming the reflective ML 120. However, in some other embodiments, the multilayered magnetic film 110 may be formed on the substrate 100 after the reflective ML 120, the capping layer 130, the buffer layer 140, and the absorption layer 150 are formed.

Figure 10:
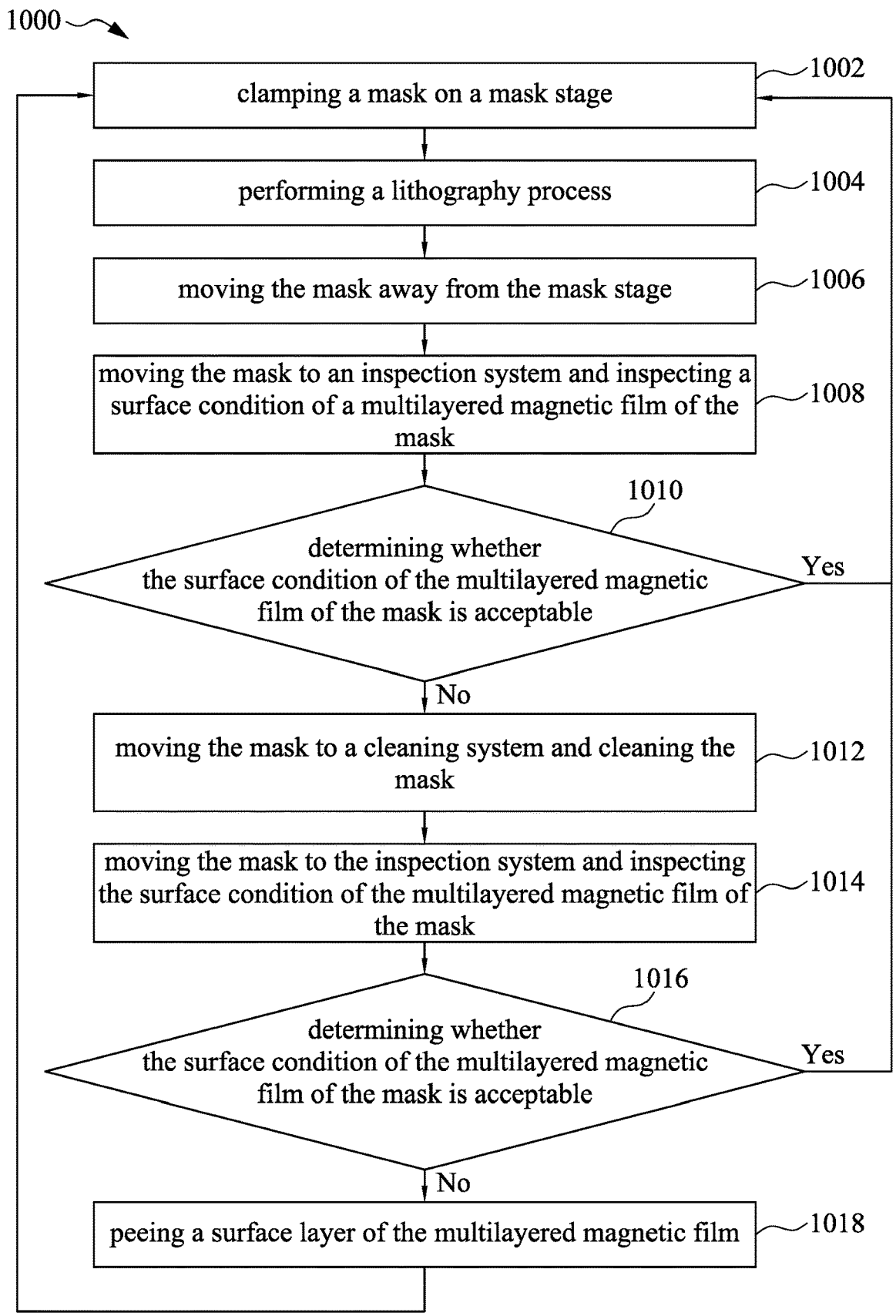
FIG. 10 is a method for operating a mask in accordance with some embodiments of the present disclosure.
Figure 11:
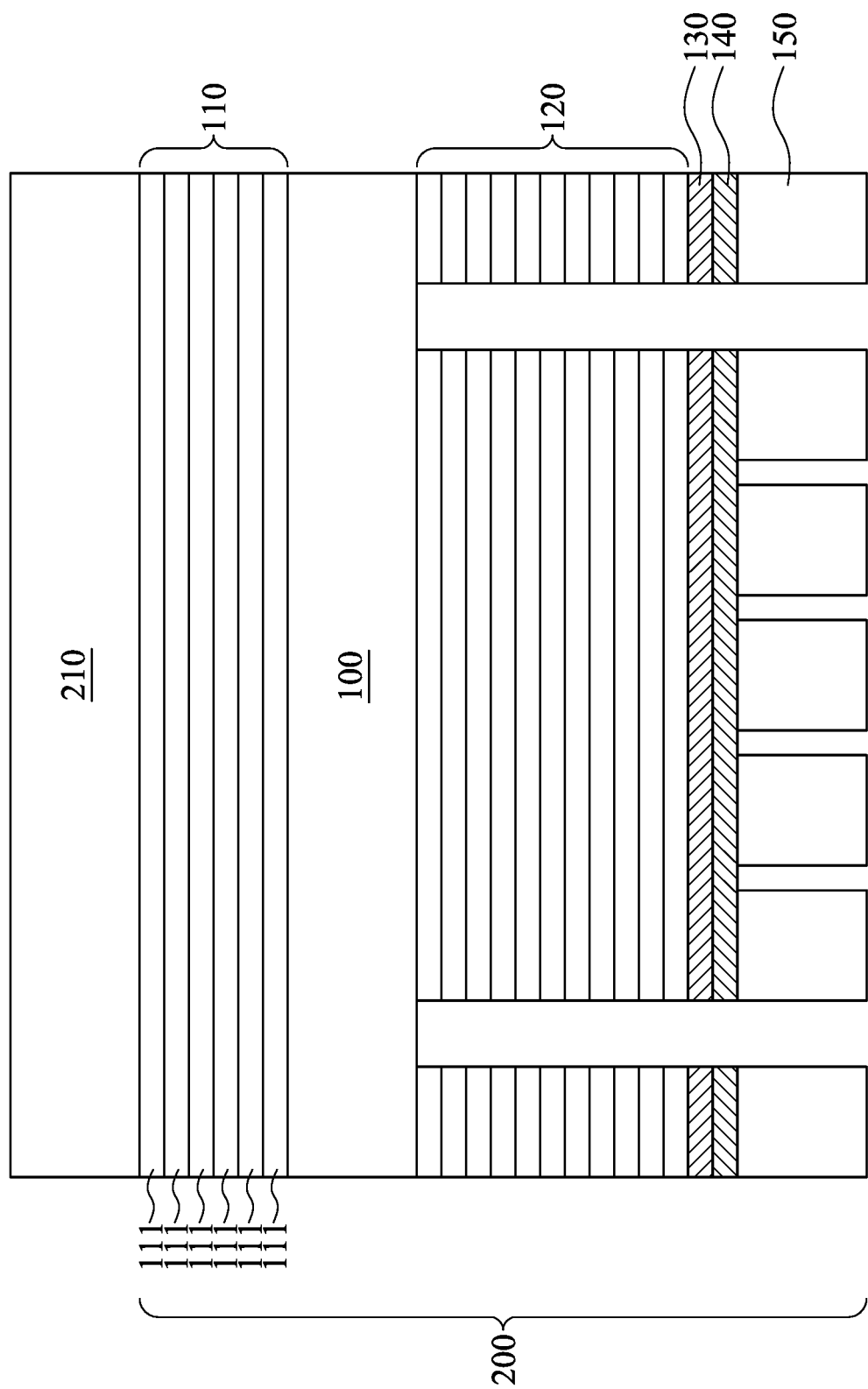
FIGS. 11-16 are a mask at various stages of operation in accordance with some embodiments of the present disclosure.
Figure 12:
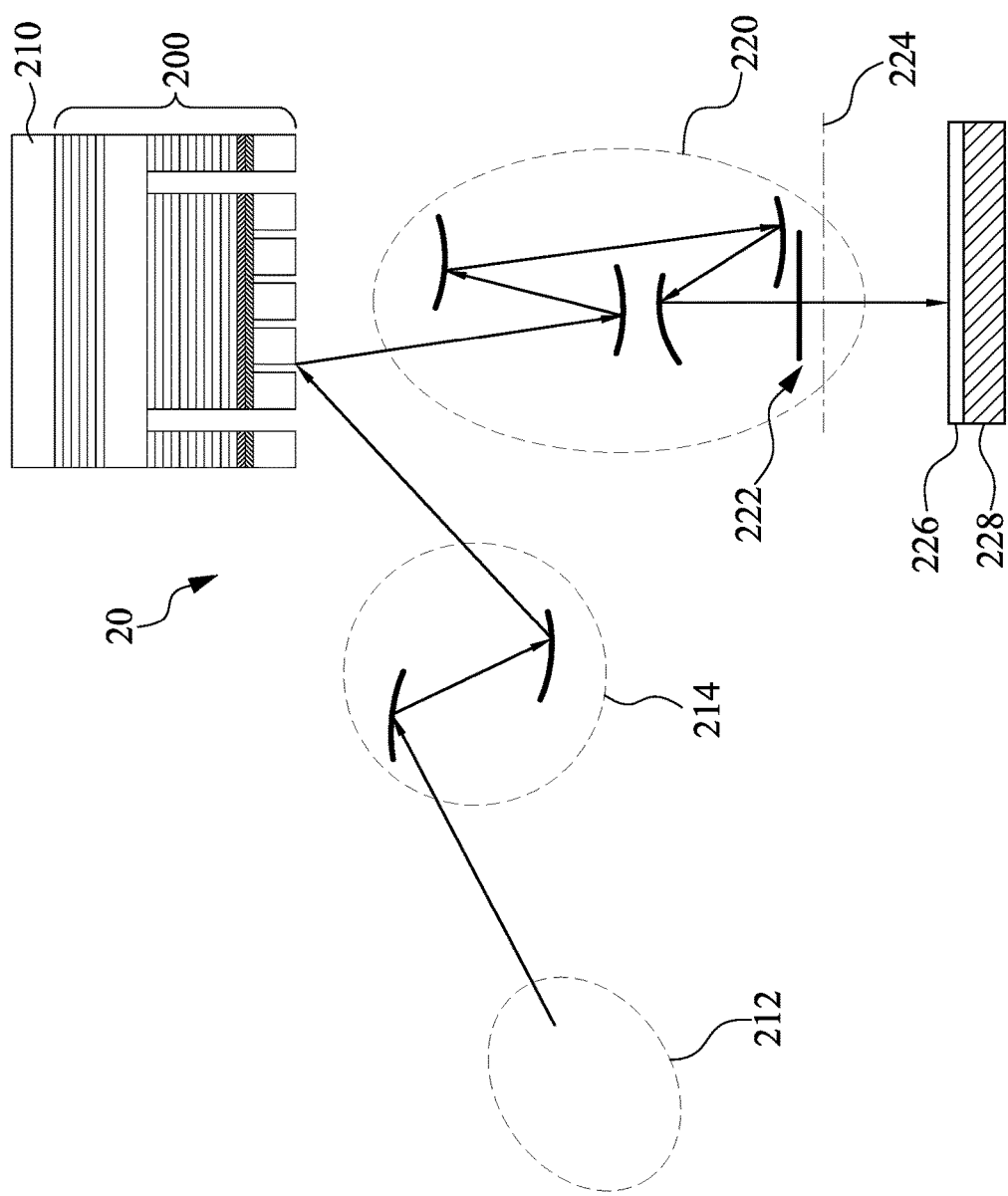
Figure 13:
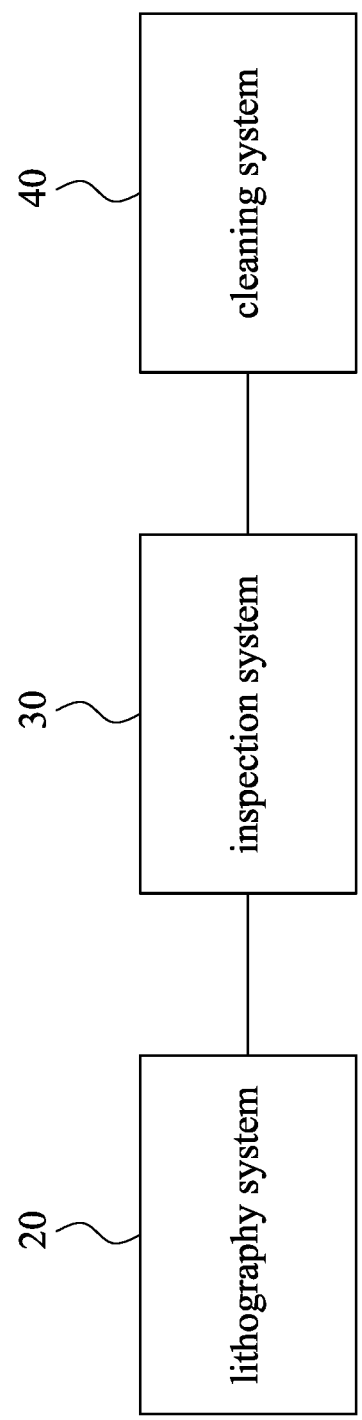

FIG. 10 is a method for operating a mask in accordance with some embodiments of the present disclosure. FIGS. 11-13 are a mask at various stages of operation in accordance with some embodiments of the present disclosure.

Reference is made to FIGS. 10 and 11. The method 1000 begins at operation 1002 where a mask is clamped on a mask stage. As shown in FIG. 11, a mask 200 is clamped on a mask stage 210 of a lithography system (e.g., the lithography system 20 in FIG. 12). The mask 200 is the same as those described in FIGS. 1 to 9, and thus relevant structural details are omitted for simplicity. The mask stage 210 is configured to secure the mask 200, in which the multilayered magnetic film 110 of the mask 200 is connected to the surface of the mask stage 210.

In some embodiments, the mask stage 210 includes an electrostatic chuck (e-chuck) to secure the mask 200. In semiconductor fabrication processes, the electrostatic chuck of the mask stage 210 may be used to hold the mask 200 for processing a lithography process. Electrostatic chuck is useful in vacuum processing environments where there is insufficient differential pressure to hold the substrate using a vacuum chuck. In some embodiments, the electrostatic chuck includes an electrostatic member supported by a support adapted to be secured in a process chamber. The electrostatic member includes an electrically insulated electrode. An electrical connector electrically connects the electrode to a voltage supply source in the process chamber. As mentioned in FIGS. 2A to 2C, the multilayered magnetic film 110 may include magnetic filler and thus has properties of a paramagnetic material. As such, when the electrode is electrically biased with respect to the mask 200 held on the mask stage 210, attractive force is generated between the multilayered magnetic film 110 and the mask stage 210, so as to clamp the mask 200 on the mask stage 210.

Reference is made to FIGS. 10 and 12. The method 1000 proceeds to operation 1004 where a lithography process is performed. In FIG. 12, shown there is a lithography system 20. The lithography system 20 may also be generically referred to as a scanner that is operable to perform lithography exposing processes with respective radiation source and exposure mode. In some embodiments, the lithography system 20 is an extreme ultraviolet (EUV) lithography system designed to expose a resist layer by EUV light. The resist layer is a material sensitive to the EUV light. The EUV lithography system 20 employs a radiation source 212 to generate EUV light, such as EUV light having a wavelength ranging between about 1 nm and about 100 nm. For example, the radiation source 212 generates an EUV light with a wavelength centered at about 13.5 nm. Accordingly, the radiation source 212 is also referred to as EUV radiation source 212. The lithography system 20 also includes the mask stage 210 configured to secure the mask 200, as described in FIG. 11.

The lithography system 20 also employs an illuminator 214. In various embodiments, the illuminator 214 includes various refractive optic components, such as a single lens or a lens system having multiple lenses (zone plates) or alternatively reflective optics (for EUV lithography system), such as a single mirror or a mirror system having multiple mirrors in order to direct light from the radiation source 212 onto the mask stage 210, particularly to the mask 200 secured on the mask stage 210. In the present embodiment where the radiation source 212 generates light in the EUV wavelength range, the illuminator 214 employs reflective optics. In some embodiments, the illuminator 214 includes a dipole illumination component.

In some embodiments, the illuminator 214 is operable to configure the mirrors to provide a proper illumination to the mask 200. In one example, the mirrors of the illuminator 214 are switchable to reflect EUV light to different illumination positions. In some embodiment, a stage prior to the illuminator 214 may additionally include other switchable mirrors that are controllable to direct the EUV light to different illumination positions with the mirrors of the illuminator 214. In some embodiments, the illuminator 214 is configured to provide an on-axis illumination (ONI) to the mask 200. In an example, a disk illuminator 214 with partial coherence σ being at most 0.3 is employed. In some other embodiments, the illuminator 214 is configured to provide an off-axis illumination (OAI) to the mask 200. In an example, the illuminator 214 is a dipole illuminator. The dipole illuminator has a partial coherence σ of at most 0.3 in some embodiments.

The lithography system 20 also includes a projection optics module (or projection optics box (POB) 220 for imaging the pattern of the mask 200 on to a semiconductor wafer 226 secured on a substrate stage 228 of the lithography system 20. The POB 220 has refractive optics (such as for UV lithography system) or alternatively reflective optics (such as for EUV lithography system) in various embodiments. The light directed from the mask 200, carrying the image of the pattern defined on the mask, is collected by the POB 220. The illuminator 214 and the POB 220 are collectively referred to as an optical module of the lithography system 20.

The lithography system 20 also includes a pupil phase modulator 222 to modulate optical phase of the light directed from the mask 200 so that the light has a phase distribution on a projection pupil plane 224. In the optical module, there is a plane with field distribution corresponding to Fourier Transform of the object (the mask 200 in the present case). This plane is referred to as projection pupil plane. The pupil phase modulator 222 provides a mechanism to modulate the optical phase of the light on the projection pupil plane 224. In some embodiments, the pupil phase modulator 222 includes a mechanism to tune the reflective mirrors of the POB 220 for phase modulation. For example, the mirrors of the POB 220 are switchable and are controlled to reflect the EUV light, thereby modulating the phase of the light through the POB 220.

In some embodiments, the pupil phase modulator 222 utilizes a pupil filter placed on the projection pupil plane. A pupil filter filters out specific spatial frequency components of the EUV light from the mask 210. Particularly, the pupil filter is a phase pupil filter that functions to modulate phase distribution of the light directed through the POB 220. However, utilizing a phase pupil filter is limited in some lithography system (such as a EUV lithography system) since all materials absorb EUV light.

As discussed above, the lithography system 20 also includes a substrate stage 228 to secure the semiconductor wafer 226 to be patterned, such as a semiconductor substrate. In some embodiments, the semiconductor wafer is a semiconductor substrate, such as a silicon substrate or other type of substrate. The semiconductor wafer 226 is coated with the resist layer sensitive to the radiation beam, such as EUV light in the present embodiment. The lithography process is performed by operating the lithography system 20 for exposing a resist layer coated on the wafer 226. When the exposed resist layer is further developed, various openings are formed in the resist layer, resulting in a patterned resist layer. The patterned resist layer is subsequently used for etching the wafer 226 in order to form a material layer with designed IC patterns on the wafer 226, thereby forming features therein or thereon for an integrated circuit. This process may be repeated, layer by layer, for forming multiple material layers on the wafer 226.

Various components including those described above are integrated together and are operable to perform lithography exposing processes. The lithography system 20 may further include other modules or be integrated with (or be coupled with) other modules.

Reference is made to FIG. 10. The method 1000 proceeds to operation 1006 where the mask is removed from the mask stage after performing the lithography process. In some embodiments, if the mask 200 is reusable, the mask 200 can be removed from the mask stage 210 and can be stored until another lithography process is intended to be performed.

It is noted that when the mask 200 are subsequently moved to and from the mask stage 210, particles may be present between an interface of the mask 200 and the mask stage 210. The particles may scratch or gouge the surface of the mask 200 and ultimately lead to breakage of the surface as well as wear away the flatness of the surface of the mask 200. For example, after a long time usage, the surface of the multilayered magnetic film 110 of the mask 200 that is connected to the mask stage 210 may be worn, such that the surface of the outmost magnetic layer 111 (i.e., surface layer) of the multilayered magnetic film 110 may have contamination presented thereon, such as scratches, clusters, dents, or particles. The defects may adversely affect the attachment between the mask 200 and the mask stage 210 and thus the resulting pattern of the photolithography process.

Before another lithography process is to be performed, the method 1000 proceeds to operation 1008 by moving the mask to an inspection system and inspecting a surface condition of a multilayered magnetic film of the mask. Reference is made to FIG. 13, shown there are a lithography system 20, an inspection system 30, and a cleaning system 40, in which the lithography system 20 is similar to or the same as the lithography system 20 described in FIG. 12.

After performing the lithography process using the lithography system 20, the mask 200 is moved from the lithography system 20 to the inspection system 30. Thereafter, the surface condition of the multilayered magnetic film 110 of the mask 200 is inspected using the inspection system 30. For example, the outmost magnetic layer 111 of the multilayered magnetic film 110 of the mask 200 is inspected to determine whether the number of particles on the outmost magnetic layer 111 exceeds a predetermined value.

Figure 14:
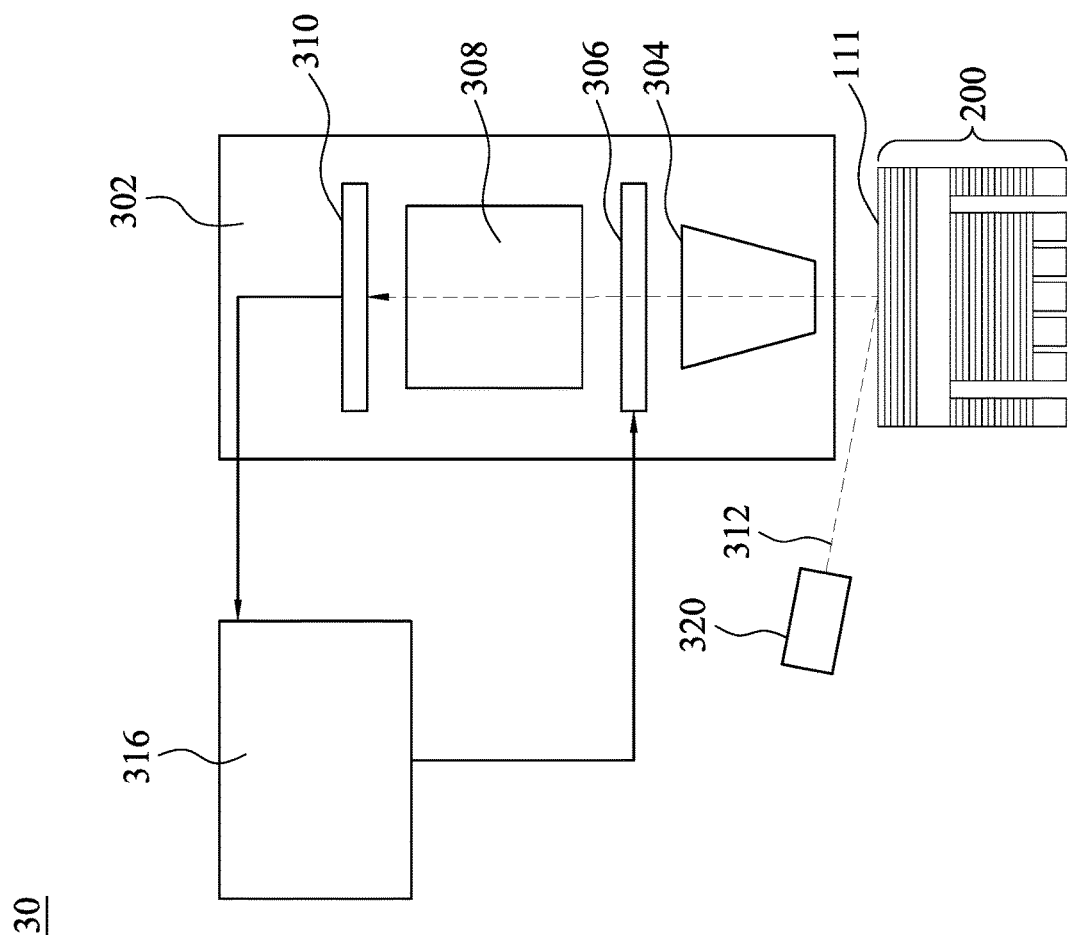

One exemplary mask inspection system is shown in FIG. 14. The exemplary mask inspection system 30 includes a channel 302 including a microscope objective 304, a pupil filter 306, a projection optical system (e.g., projection lens) 308, and a detector 310. A radiation (e.g., laser) beam 312 generated from a light source 320 illuminates the outmost magnetic layer 111 of the mask 200. Pupil filter 306 is used to block optical scattering due to the pattern of the magnetic layer 111 of the mask 200. A processing unit 316 can be used to control the filtering of pupil filter 306 based on the pattern of the magnetic layer 111 of the mask 200. Accordingly, filter 306 is provided as a spatial filter in a pupil plane relative to the magnetic layer 111 of the mask 200 and is associated with the pattern of the magnetic layer 111 of the mask 200 so as to filter out radiation from the scattered radiation. Detector 310 detects a fraction of radiation that is transmitted by projection optical system 308 for detection of particles on the magnetic layer 111. The processing unit 316 thus counts the number of particles based on detection result generated from the detector 310. In some embodiments, the processing unit 316 is a central processing unit (CPU) in a computer or the like.

Referring back to FIG. 10, the method 1000 proceeds to operation 1010 by determining whether the surface condition of a multilayered magnetic film of the mask is acceptable. For example, the processing unit 316 can determine whether the counted number of particles number exceeds a threshold value. The threshold value may be a predetermined data stored in a memory associated with the processing unit 316. The surface condition of the multilayered magnetic film can be determined as acceptable if the counted number of particles number does not exceed the threshold value. On the contrary, the surface condition of the multilayered magnetic film can be determined as unacceptable if the counted number of particles number exceeds the threshold value.

If the counted number of particles does not exceed the threshold value (i.e., the surface condition of the outmost magnetic layer 111 of the multilayered magnetic film 110 is determined as acceptable), the method 1000 then returns back to operation 1002 and continues proceeding operations 1002-1008. That is, the mask 200 is moved back to the lithography system 20 and clamped on the mask stage 210, and then another lithography process is performed. After performing the lithography process, the mask 200 is removed from the mask stage 210. The process details are similar to those described in FIGS. 10-12.

Figure 15:
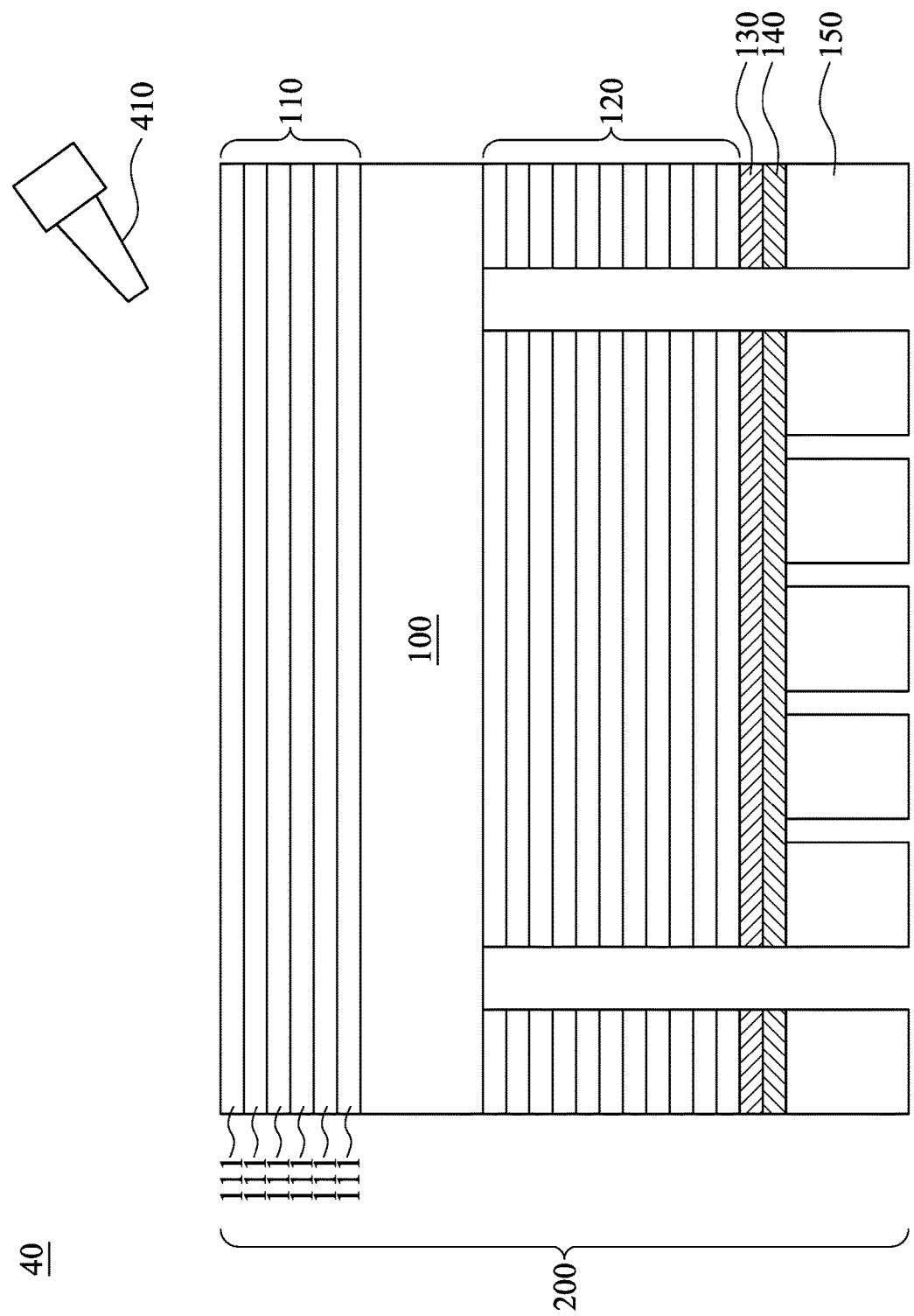

However, if the counted number of particles exceeds the threshold value (i.e., the surface condition of the outmost magnetic layer 111 of the multilayered magnetic film 110 is determined as unacceptable), the method 1000 proceeds to operation 1012 by moving the mask to a cleaning system and cleaning the mask. Reference is made to FIG. 13, the mask 200 is moved from the inspection system 30 to the cleaning system 40, and then the mask 200 is cleaned. For example, in FIG. 15, shown there is an example of the cleaning system 40. The cleaning system 40 includes a purging device 410 having a gas exit. In some embodiments, the gas exit is oriented toward the surface of the outmost magnetic layer 111 of the mask 200, the gas exit of the purging device 410 can thus provide a gas toward the mask 200, so as to blow particles away from the mask 200. In some other embodiments, the cleaning may include a cleaning process performed using a scrubber. For example, the scrubber may be a brush scrubber including brush bristles (e.g., nylon brush bristles) used to remove particles from the surface of the outmost magnetic layer 111 of the mask 200.

After the surface of the outmost magnetic layer 111 of the mask 200 is cleaned, the method 1000 proceeds to operation 1014 by moving the mask to the inspection system and inspecting the surface condition of a multilayered magnetic film of the mask. For example, the mask 200 can be moved from the cleaning system 40 back to the inspection system 30. Thereafter, the mask 200 undergoes the inspection process using the inspection system 30 as described previously. For example, the inspection system 30 can count the particle number on the mask 200. Operation 1014 is similar to operation 1008 and thus detailed description of operation 1014 is not repeated for the sake of brevity.

Then, the method 1000 proceeds to operation 1016 by determining whether the surface condition of the multilayered magnetic film of the mask is acceptable. For example, the inspection system can determine whether the counted number of particles exceeds the threshold value. The operation 1016 is similar to the operation 1010, and thus the detailed description of operation 1016 is not repeated for the sake of brevity.

If the counted number of particles does not exceed the threshold value (i.e., the surface condition of the outmost magnetic layer 111 of the multilayered magnetic film 110 is determined as acceptable), the method 1000 then returns back to operation 1002 and continues proceeding operations 1002-1008. That is, the mask 200 is moved back to the lithography system 20 and clamped on the mask stage 210, and another lithography process is performed. After performing the lithography process, the mask 200 is removed from the mask stage 210. The process details are similar to those described in FIGS. 10-12.

However, if the counted number of particles exceeds the threshold value (i.e., the surface condition of the outmost magnetic layer 111 of the multilayered magnetic film 110 is still determined as unacceptable), the method 1000 proceeds to operation 1018 where a surface layer of the multilayered magnetic film of the mask is peeled as discussed in greater detail below with respect to FIG. 16.

Figure 16:
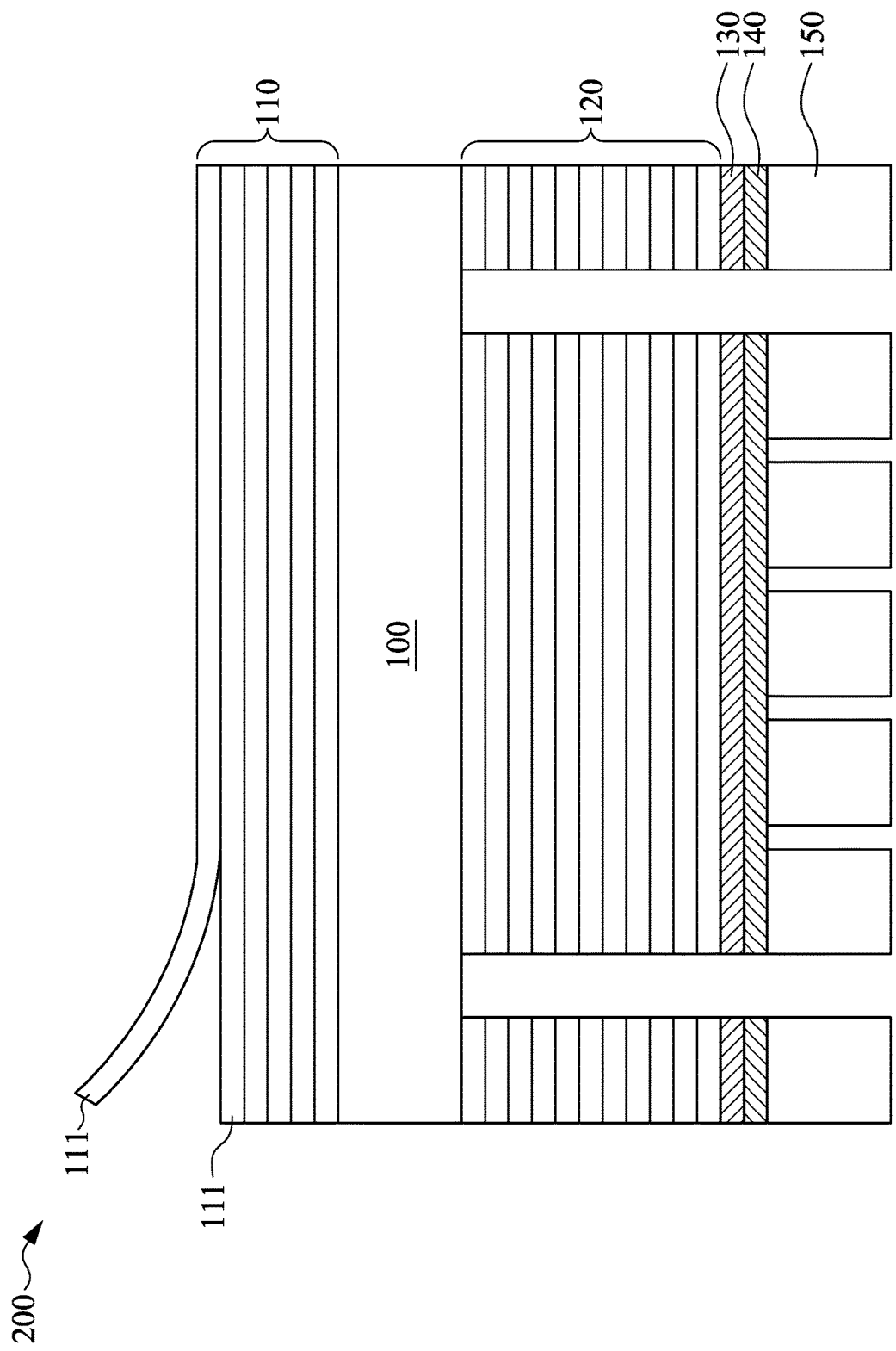

Reference is made to FIG. 16. As mentioned in FIGS. 2A to 2C, the magnetic layers 111 of FIG. 2A (or magnetic layers 112 and 114 in FIGS. 2A and 2C) are stretch releasing films. That is, the outmost magnetic layer 111 can be cleanly removed from a surface of the next magnetic layer 111 without damaging the surface of the next magnetic layer 111. In some embodiments, the outmost magnetic layer 111 can be peeled off manually. After the outmost magnetic layer 111 is removed, the surface of the subsequent magnetic layer 111 is exposed. Since this exposed surface is protected by the removed magnetic layer 111 during previous processes, the exposed surface is substantially new and flat.

Then, the operations 1002 to 1004 may be performed accordingly. That is, the renewed mask 200 is clamped on the mask stage 210, and another lithography process is performed. After the lithography process, the mask 200 is removed from the mask stage 210. The process details are similar to those described in FIGS. 10-13. As mentioned before, the mask 200 is renewed by removing the worn magnetic layer 111. In this way, the lifetime of the mask 200 can be extended, and further save the cost of mask. Further, since the mask 200 may be renewed to have a flat surface, the leveling control may be improved, which in turn will facilitate the process performance.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a multilayered magnetic film is formed on a substrate of a mask, and thus the worn film of the multilayered magnetic film can be removed from the mask, thereby extending the lifetime of the mask and saving the cost of the mask. Moreover, since the mask can be renewed by removing a worn film to expose a flat surface of the subsequent film, the leveling control may be improved, which in turn will facilitate the process performance.

In some embodiments of the present disclosure, a method includes clamping a mask on a mask stage, in which the mask includes a multilayered magnetic film; performing a first lithography process by using the mask; moving the mask away from the mask stage; and determining whether a surface condition of a surface layer of the multilayered thin film is acceptable; and peeling the surface layer of the multilayered magnetic film from the multilayered magnetic film when the surface condition of the surface layer is determined as unacceptable.

In some embodiments of the present disclosure, a method includes attaching a first magnetic layer on a substrate; attaching a second magnetic layer on the first magnetic layer; forming a reflective multilayer on the substrate; forming an absorption layer on the reflective multilayer; and patterning the absorption layer.

In some embodiments of the present disclosure, a mask includes a substrate, a multilayered magnetic film, a reflective multilayer, and a patterned absorption layer. The multilayered magnetic film is disposed on the substrate, in which the multilayered magnetic film includes a plurality of magnetic layers. The substrate is between the multilayered magnetic film and the reflective multilayer. The reflective multilayer is between the patterned absorption layer and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   clamping a mask on a mask stage, wherein the mask comprises a substrate having a first side and a second side opposite to the first side, reflective multilayer on the first side of the substrate, a multilayered magnetic film on the second side of the substrate, and wherein the multilayered magnetic film is in contact with a surface of the mask stage;
   performing a first lithography process by using the mask;
   after performing the first lithography process, determining whether a surface condition of a surface layer of the multilayered magnetic film is acceptable; and
   peeling the surface layer of the multilayered magnetic film from the multilayered magnetic film when the surface condition of the surface layer is determined as unacceptable.

2. The method of claim 1, further comprising:
   after peeling the surface layer of the multilayered magnetic film, clamping the mask back to the mask stage; and
   after clamping the mask back to the mask stage, performing a second lithography process.

3. The method of claim 2, wherein:
   peeling the surface layer of the multilayered magnetic film is performed such that a flat surface of another layer of the multilayered magnetic film is exposed; and
   clamping the mask back to the mask stage comprises connecting the flat surface of the another layer of the multilayered magnetic film to the mask stage.

4. The method of claim 1, further comprising:
   clamping the mask back to the mask stage when the surface condition of the surface layer is acceptable; and
   after clamping the mask back to the mask stage, performing a second lithography process.

5. The method of claim 1, wherein peeling the surface layer of the multilayered magnetic film is performed manually.

6. The method of claim 1, wherein clamping the mask on the mask stage comprises generating an attractive force between an electrostatic chuck of the mask stage and a magnetic material of the multilayered magnetic film of the mask.

7. The method of claim 1, wherein peeling the surface layer of the multilayered magnetic film comprises detaching an adhesive layer of the surface layer of the multilayered magnetic film from a releasing layer of another layer of the multilayered magnetic film.

8. A method, comprising:
   moving a mask to a cleaning system, wherein mask comprises a substrate having a first side and a second side opposite to the first side, a reflective multilayer on the first side of the substrate, and magnetic films stacked on each other over the second side of the substrate;
   cleaning an outmost magnetic film of the magnetic films;
   moving the mask from the cleaning system to an inspection system;
   determining whether a surface condition of a first surface layer of the multilayered magnetic film is acceptable; and
   peeling the first surface layer of the multilayered magnetic film from the multilayered magnetic film when the surface condition of the surface layer is determined as unacceptable, such that a subsequent layer becomes a second surface layer of the multilayered magnetic film.

9. The method of claim 8, wherein cleaning the outmost magnetic film of the magnetic films comprising providing a gas toward the first surface layer of the multilayered magnetic film to blow particles away from the first surface layer of the multilayered magnetic film.

10. The method of claim 8, wherein cleaning the outmost magnetic film of the magnetic films comprising removing particles away from the first surface layer of the multilayered magnetic film using a brush scrubber.

11. The method of claim 8, wherein determining whether the surface condition of the first surface layer of the multilayered magnetic film is acceptable is performed by determining whether a number of particles on the first surface layer of the multilayered magnetic film exceeds a threshold value.

12. The method of claim 8, further comprising:
prior to moving the mask to the cleaning system, moving the mask to a lithography system; and
attaching the first surface layer of the multilayered magnetic film to a mask stage.

13. The method of claim 12, further comprising:
after peeling the first surface layer of the multilayered magnetic film from the multilayered magnetic film, moving the mask back to the lithography system; and
attaching the second surface layer of the multilayered magnetic film to the mask stage.

14. A method, comprising:
moving a mask to a lithography system, wherein the mask comprises a substrate having a first side and a second side opposite to the first side, a reflective multilayer on the first side of the substrate, and magnetic films stacked on each other on the second side of the substrate;
clamping the mask on a mask stage such that the magnetic films are between the substrate and the mask stage;
performing a first lithography process by using the mask;
moving the mask away from the lithography system;
moving the mask to an inspection system;
determining whether a number of particles on an outmost film of the magnetic films exceeds a predetermined value;
removing the outmost film of the magnetic films from the magnetic films when the number of particles on the outmost film of the magnetic films exceeds the predetermined value; and
moving the mask back to the lithography system.

15. The method of claim 14, wherein removing the outmost film of the magnetic films is performed by detaching an adhesive layer of the outmost film of the magnetic films from a releasing layer of another film of the magnetic films.

16. The method of claim 14, further comprising performing a cleaning process to the outmost film of the magnetic films after moving the mask away from the lithography system and prior to moving the mask to the inspection system.

17. The method of claim 14, wherein each of the magnetic films comprises an adhesive layer, a base layer, and a release layer, and the adhesive layer and the release layer are disposed on opposite sides of the base layer.

18. The method of claim 17, wherein the adhesive layer of one of the magnetic films is connected to the release layer of another one of the magnetic films.

19. The method of claim 17, wherein the adhesive layers of the magnetic films comprise magnetic material.

20. The method of claim 17, wherein the base layers of the magnetic films comprise magnetic material.

* * * * *